United States Patent
Singleton et al.

(10) Patent No.: US 9,246,519 B2
(45) Date of Patent: Jan. 26, 2016

(54) TEST PATTERN OPTIMIZATION FOR LDPC BASED FLAWSCAN

(71) Applicant: LSI Corporation, Milpitas, CA (US)

(72) Inventors: Jefferson E. Singleton, Longmont, CO (US); Shaohua Yang, San Jose, CA (US); Bruce A. Wilson, San Jose, CA (US); Keenan T. O'Brien, Longmont, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 33 days.

(21) Appl. No.: 13/672,218

(22) Filed: Nov. 8, 2012

(65) Prior Publication Data

US 2014/0129890 A1    May 8, 2014

(51) Int. Cl.
*G06F 11/263* (2006.01)
*H03M 13/00* (2006.01)
*H03M 13/11* (2006.01)
*H03M 13/35* (2006.01)

(52) U.S. Cl.
CPC .......... *H03M 13/6356* (2013.01); *H03M 13/11* (2013.01); *H03M 13/35* (2013.01); *H03M 13/63* (2013.01); *H03M 13/6343* (2013.01)

(58) Field of Classification Search
CPC ................. G01R 31/31813; G01R 31/318371; G01R 31/318307; G01R 31/31921; G11B 20/1833; H03M 13/35; H03M 13/6356; H03M 13/63; H03M 13/6343; H03M 13/11; G06F 11/1076; G06F 11/1008; G06F 3/0601

USPC ........... 714/738, E11.177, E11.034; 375/295
See application file for complete search history.

(56) References Cited

U.S. PATENT DOCUMENTS

| | | | | | |
|---|---|---|---|---|---|
| 5,748,641 | A | * | 5/1998 | Ohsawa | 714/720 |
| 2003/0063566 | A1 | * | 4/2003 | Abramovitch et al. | 370/241 |
| 2008/0178061 | A1 | * | 7/2008 | Mead | 714/766 |
| 2008/0215893 | A1 | * | 9/2008 | Bliss et al. | 713/189 |
| 2011/0075289 | A1 | * | 3/2011 | Ozdemir et al. | 360/48 |
| 2011/0145680 | A1 | * | 6/2011 | Akiyama et al. | 714/769 |
| 2011/0317564 | A1 | * | 12/2011 | Saibi et al. | 370/249 |
| 2012/0170678 | A1 | * | 7/2012 | Krachkovsky et al. | 375/295 |

OTHER PUBLICATIONS

Tuan Ta, "A Tutorial on Low Density Parity-Check Codes," Provided by The University of Texas at Arlington, Feb 2011 (Accessed from http://www.techrepublic.com/resource-library/whitepapers/a-tutorial-on-low-density-parity-check-codes/).*

* cited by examiner

*Primary Examiner* — Albert Decady
*Assistant Examiner* — Kyle Vallecillo

(57) ABSTRACT

A method for producing a LDPC encoded test pattern for media in a LDPC based drive system includes adding error detection code data to a predominantly zero bit test pattern and adding additional zero bits to produce a test pattern of a desirable length. The test pattern may then be scrambled to produce a desirable flaw detection test pattern. The flaw detection test pattern may then be encoding with an LDPC code, or other error correction code with minimal disturbance to the run length constraints of the data pattern, and written to a storage medium.

20 Claims, 5 Drawing Sheets

TEST PATTERN OPTIMIZATION FOR LDPC BASED FLAWSCAN

FIELD OF THE INVENTION

The present invention is directed generally toward defect detection in media devices, and more particularly toward encoded data in defect scans.

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on codeword length) property.

During media flaw scans, which typically occur during the manufacture and assembly of storage devices, drive makers write test patterns over the entire media and use flaw detection circuits in the read channel to identify defects in the media. This information is used to determine the final drive format. One common traditional test pattern is a 4-T-periodic repeating binary pattern.

After manufacture, drive makers require that even uninitialized sectors (sectors that do not yet contain user data) of the media can be read and recovered during drive operation. Because traditional flaw scan test patterns are not true low-density parity-check (LDPC) codewords, they cannot be used for this purpose in an LDPC-based drive system. Instead, drive makers typically write dummy data sectors over the entire media following the flaw scan, requiring a second write of the entire media.

In order to reduce manufacturing time by eliminating the second full-media write, drive makers are exploring the possibility of using run-length limited (RLL) LDPC-based test patterns for media flaw scans. Such test patterns are also decodable in the field. However, a general LDPC-based test pattern may contain runs of Nyquist or DC patterns that interfere with the read channel ability to detect media defects reliably.

Most flaw detection is based on detecting some unexpected change in signal quality; loss of amplitude is a commonly used flaw detection metric. Due to the low-pass nature of the over-all system, Nyquist patterns have very low signal amplitude even when there is no defect on the media. Effectively, a Nyquist pattern does not provide enough nominal signal amplitude in order to effectively detect changes in signal quality. DC patterns can provide adequate signal amplitude, but do not provide any phase information for phase-based detection algorithms.

Consequently, it would be advantageous if an apparatus existed that is suitable for generating LDPC-based test patterns with minimal Nyquist and DC pattern runs.

SUMMARY OF THE INVENTION

Accordingly, the present invention is directed to a novel method and apparatus for generating LDPC-based test patterns with minimal Nyquist and DC pattern runs.

One embodiment of the present invention is a method for producing an LDPC based flaw detection pattern including receiving an initial test pattern from a hard disk controller. The initial test pattern may comprise substantially all zero bits. The initial test pattern may be encoded with error detection and correction data and appended with zero bits to achieve a length commensurate with an RLL code, though the final test pattern may not be RLL readable. The test pattern may then be scrambled with a low-Nyquist/DC-content pattern, such as a 4T- or 8T-periodic pattern, to facilitate flaw detection. The test pattern may then be encoded according to an LDPC code.

Another embodiment of the present invention is a computing device suitable for producing an LDPC based flaw detection pattern. The computing device may receive an initial test pattern from a hard disk controller. The initial test pattern may comprise substantially all zero bits, but may include metadata required by the storage system. The computing device may encode the initial test pattern with error detection and correction data and append zero bits to the test pattern to achieve a length commensurate with an RLL code, though the final test pattern may not be RLL readable. The computing device may then scramble the test pattern with a low-Nyquist/DC-content pattern, such as a period pattern, to facilitate flaw detection. The computing device may then encode the test pattern according to an LDPC code.

Another embodiment of the present invention is a computing device suitable for reading both LDPC based flaw detection patterns, and normal LDPC encoded user data patterns. The computing device may receive a data pattern from a storage medium. The data pattern may comprise an LDPC encoded, non-RLL readable test pattern, or may be an LDPC encoded user data pattern. The computing device may decode the test pattern according to a LDPC code. Based on information extracted from the data pattern during LDPC decoding, the computing device may determine if the data pattern is a test pattern or a user data pattern. The computing device may further decode user data patterns per normal data RLL/EDC decoding. When it identifies a test pattern, the computing device may descramble the decoded test pattern according to a low-Nyquist/DC-content pattern. The computing device may remove zero bits based on a specified RLL code expansion and remove error detection and correction data to produce a checkable test pattern that may nominally comprise all zero bits.

An alternative technique to test pattern identification may involve detection of non-data identification patterns embedded in the data written to the media. For example, the system may employ a different sync mark pattern for test data pattern than is used for user data pattern. Such a system may search for both sync mark patterns when reading data from the storage medium, and identify user or test data patterns based on which sync mark pattern is detected.

A further enhancement to the invention may include an LDPC parity insertion structure designed to minimize impact to the run length constraints of the data pattern. For example, given a 4T-periodic input data pattern (minimum and maximum run length of 2T), if the LDPC is structured such that no more than a single parity bit is inserted every 4T, the minimum and maximum run length of the resulting pattern is 2T and 3T respective, maintaining low DC content and preventing any Nyquist patterns.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
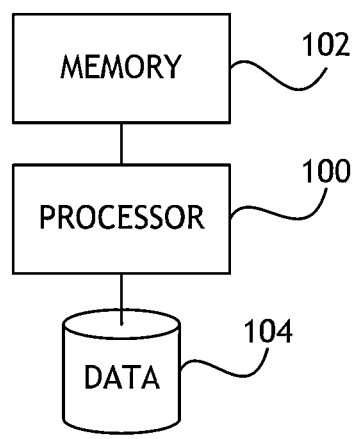
FIG. 1 shows a block diagram of a computing device useful for implementing the present invention.

Referring to FIG. 1, a block diagram of a computing device useful for implementing the present invention is shown. The computing device may include a processor 100 and memory 102 connected to the processor 100 to store compute executable program code. The processor 100 may also be connected to a data storage medium 104 such as a hard disk drive (HDD).

The processor 100 may produce a flaw detection test pattern as described herein. The flaw detection test pattern may be written to the data storage medium 104. Defects in the data storage medium 104 may be rendered detectable by the flaw detection test pattern.

Figure 2:
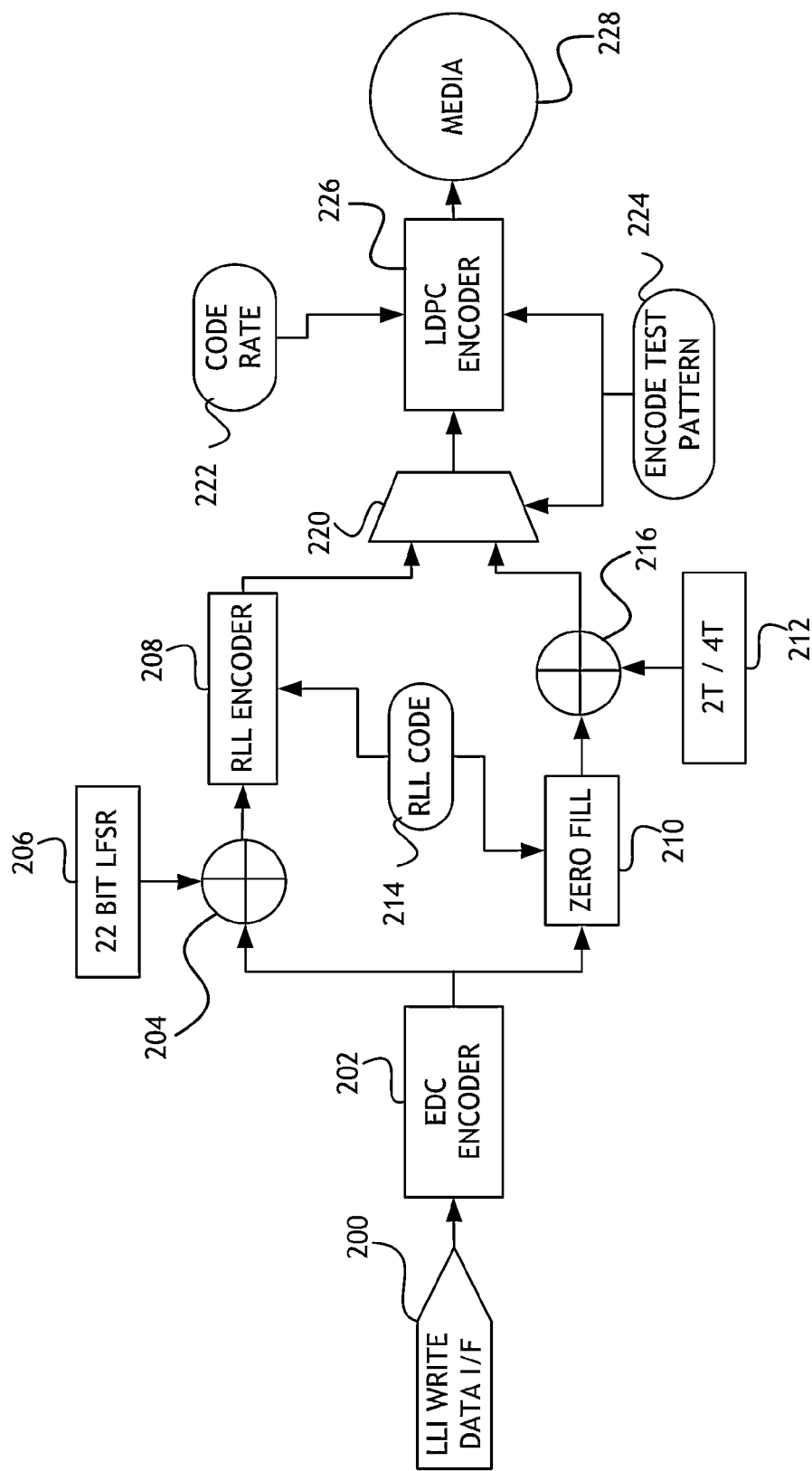
FIG. 2 shows a block diagram of a device for encoding a flaw detection pattern to a medium.

Referring to FIG. 2, a block diagram of a device for encoding a flaw detection pattern to a medium is shown. The device may include a long latency interface (LLI) 200 to receive data from a hard disk controller (HDC). The data may be substantially zero pattern data or the data may contain some metadata. The LLI 200 may transfer the data to an error detection code (EDC) encoder 202. The EDC encoder 202 may add EDC data to the data from the LLI 200.

The data from the EDC encoder 202 may then follow two data paths. In a first data path, the data may be combined with data from a linear feedback shift register 206 through an additive element 204 such as an exclusive disjunction operator. That data may then be encoder by a run-length limited (RLL) encoder 208. RLL codes place minimum and maximum boundaries on the length of "runs" (contiguous stretches of data) so that boundaries between bits can be accurately found. The code rate of the RLL code may be selectable. The RLL encoded data may then be sent to a multiplexer 220.

Alternatively, in the second data path the data from the EDC encoder 202 may be sent to a zero fill element 210 that may add zero bits to the data stream based on an expansion specified by the selected RLL code 214. The data may then be combined with data from a low-Nyquist/DC-content encoding element 212 through an additive element 216 to produce low-Nyquist/DC-contentscrambled data. The scrambled data may then be sent to the multiplexer 220.

The multiplexer 220 may then transfer a multiplexed data stream to a low-density parity-check (LDPC) encoder 226. The LDPC encoder may seed its encoding process differently depending on whether the input pattern is a used data pattern or a test pattern. In either case, the LDPC encoder 226 may convert the multiplexed data to valid LDPC codewords according to a given code rate 222 and a test pattern seed. The LDPC encoded data may be written to the media 228 that is the subject of the flaw detection. The LDPC encoded data may not be RLL decodable.

Such a device may produce a flaw detection test pattern for the media 228 that results in readable, recoverable data in every sector of the media 228, but minimizes the possibility of Nyquist patterns and DC patterns that may compromise flaw detection.

One skilled in the art may appreciate that the elements of FIG. 2 may be embodied in computer executable program code executing on a processor.

Figure 3:
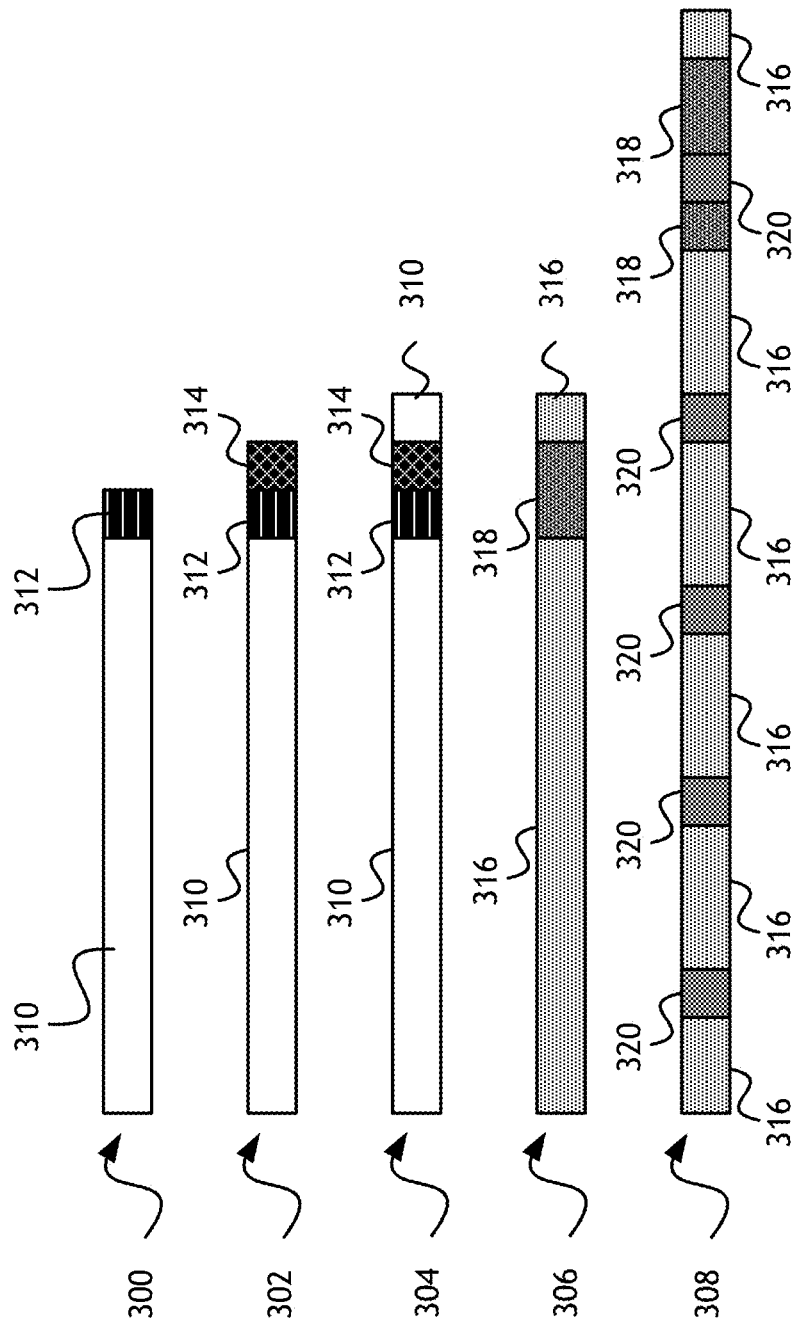
FIG. 3 shows a block diagram of a flaw detection pattern at various phases of processing.

Referring to FIG. 3, a block diagram of a flaw detection pattern at various phases of processing is shown. A HDC may produce an initial data stream 300 comprised of zero bits 310. The initial data stream 300 may also include metadata 312. The initial data stream 300 may be processed by an EDC encoder to produce EDC data 314. EDC data 314 may be appended or otherwise incorporated into to the initial data stream 300 to produce an EDC encoded data stream 302. Various encoding techniques may require a data stream of a specific size, or media sector size may dictate the size of a data stream. A zero fill element may adjust the size of the EDC encoded data stream 302 by appending or otherwise incorporating additional zero bits 310 to produce a zero filled data stream 304. The zero filled data stream 304 may be scrambled according to a low-Nyqsuit/DC-content pattern, such as a 4T- or 8T-periodic repeating pattern, to produce a low-Nyquist/DC-content scrambled data stream 306. The scrambled data stream 306 may include periodic repeating data 316 in place of one or more zero bit 310 runs and scrambled data 318 corresponding to the metadata 312 and EDC data 314. Low-Nyquist/DC-content repeating data 316 enables flaw detection for those portions of the media. A LDPC encoder may encode the scrambled data stream 306 according to a desired LDPC encoding algorithm defined by a given code rate and encoding test pattern seed. The resulting LDPC encoded data stream 308 may include parity bits 320 to allow the data to be read and recovered. The LDPC encoded data stream 308 may be written to a medium such as a HDD. The LDPC encoded data stream 308 may be a valid test pattern for flaw detection purposes and may also satisfy the requirement of readable data on every sector of the medium. Furthermore, by bypassing RLL encoding, the number of Nyquist and DC runs in the LDPC encoded data stream 308 may be minimized.

Figure 4:
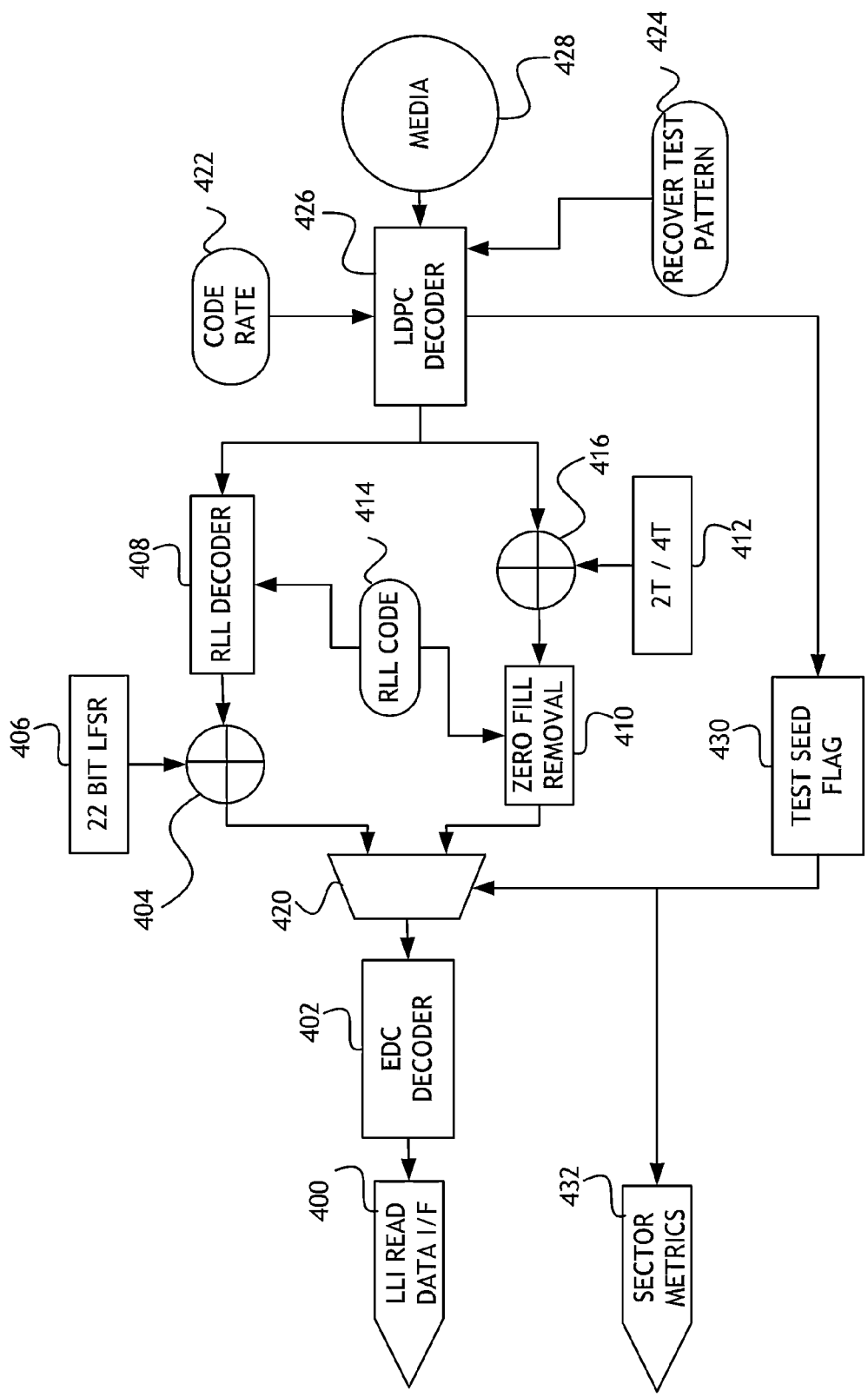
FIG. 4 shows a block diagram of a device for reading a flaw detection pattern from a medium.

Referring to FIG. 4, a block diagram of a device for reading a flaw detection pattern from a medium is shown. A medium 428, such as a HDD, may be written with a LDPC encoded test pattern. The LDPC encoded test pattern may be a non-RLL-decodable pattern suitable for performing flaw detection on the medium 428.

An LDPC decoder 426 may receive a LDPC encoded data pattern from the medium 428. The LDPC decoder 426 may decode the LDPC encoded data pattern based on a given code rate 422 and a given recovery test pattern seed to produce a scrambled data stream. The scrambled data stream may then follow two separate data paths, depending on seed information recovered during LDPC decoding.

In a first data path, the scrambled data stream may be decoded by an RLL decoder 408 according to an RLL code 414 to produce an RLL decoded data stream. The RLL decoded data stream may be combined with data from a twenty-two bit linear feedback shift register 406 in a combining element 404, and the resulting data stream sent to a multiplexer 420. This path is used for sectors identified by the LDPC decoder as user data patterns.

Alternatively, the scrambled data stream may be combined with data from a corresponding low-Nyquist/DC-content decoding element 412 in a combining element 416, such as an element for performing an exclusive disjunction operation, to produce an EDC encoded data stream. The EDC encoded data stream may include zero fill bits. A zero fill removal element 410 may remove extraneous zero fill bits so that the EDC encoded data stream may be decoded. The EDC data stream may than be sent to a multiplexer 420. This path is used for sectors identified by the LDPC decoder as test patterns.

A data stream from the multiplexer 420 may be sent to an EDC decoding element 402. The EDC decoding element 402 may decode the data stream form the multiplexer 420 to produce a final data stream which may be sent to a hard disk controller. For test patterns, the final data stream may comprise zero bits and possibly metadata. The hard disk controller may also receive a test seed flag through a sector metrics interface 432. The test seed flag may be produced by a test seed flag element 430 based on seed data recovered by the LDPC decoding element 426.

One skilled in the art may appreciate that the elements of FIG. 4 may be embodied in computer executable program code executing on a processor.

Figure 5:
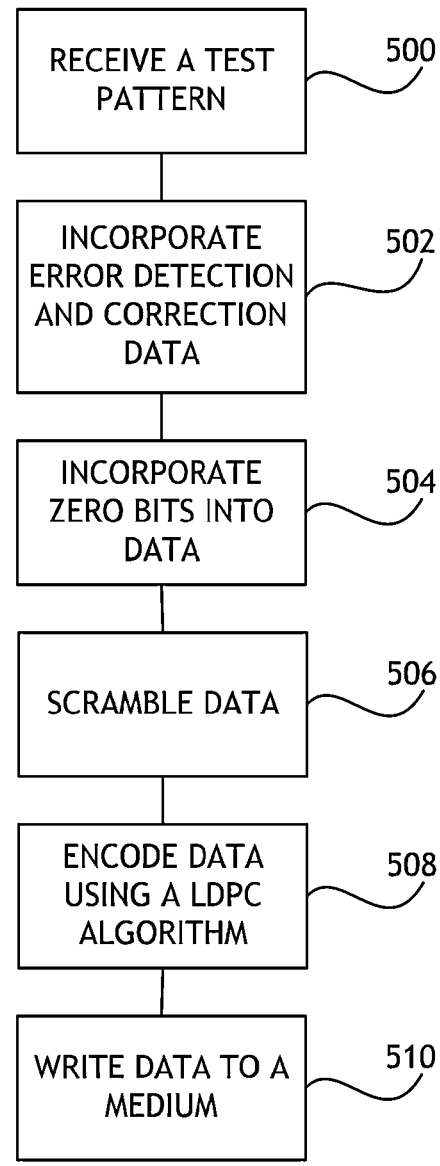
FIG. 5 shows a flowchart of a method for encoding a flaw detection pattern to a medium.

Referring to FIG. 5, a flowchart of a method for encoding a flaw detection pattern to a medium is shown. A processor executing the method may receive 500 a test pattern from a hard disk controller. The test pattern may comprise zero bits and may further comprise metadata. An EDC encoding element, possibly embodied in computer executable program code executed by the processor, may incorporate 502 error detection code data into the test pattern. Where a data stream of a particular length is required, for example when a test pattern requires a specific number of bits, a zero bit element may incorporate 504 zero bits into the test pattern to achieve a desired run length. The test pattern may then be scrambled 506 based on pattern suitable for performing flaw detection such as a 4T- or 8T-periodic pattern. Where the drive system being tested is an LDPC based system, the test pattern may then be encoded 508 according to a LDPC algorithm based on a code rate and a test seed pattern. The test pattern may then be written 510 to the medium being tested.

By this method, a test pattern may be written to a storage medium in a LDPC system, and the test pattern may also serve the purpose of placing readable, recoverable data in every sector of the medium. The method may also produce an LDPC encoded data set that is not RLL decodable but that minimizes the potential for Nyquist and DC runs that may adversely affect the flaw detection function of the system.

While the specific embodiments discussed herein refer specifically to LDPC encoding methods, other encoding methods may be used to implement the present invention. Any encoding method useful in implementing the present invention must not introduce substantial disruption into the low Nyquist and DC pattern.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of producing a low density parity check (LDPC) encoded flaw detection pattern comprising:
   receiving a media-writable test pattern for testing readable sectors in the media;
   adding error detection code data to the media-writable test pattern;
   adding one or more bits according to an expansion commensurate with a first coding technique;
   scrambling the test pattern; and
   encoding the test pattern according to a second coding technique,
   wherein the encoded test pattern includes an indicator to enable a decoder to distinguish user data decodable according to the first coding technique and test pattern data decodable according to the second coding technique, and wherein the encoded test pattern renders media defects in a data storage medium detectable.

2. The method of claim 1, wherein adding one or more bits according to an expansion commensurate with the first coding technique comprises adding zero bits to the test pattern to achieve a desired run length based on a specific run length limited (RLL) expansion.

3. The method of claim 1, wherein scrambling the test pattern comprises scrambling the test pattern with a low-Nyquist/DC-content test pattern.

4. The method of claim 3, wherein scrambling the test pattern comprises performing an exclusive disjunction operation on the test pattern and the low-Nyquist/DC-content test pattern.

5. The method of claim 1, further comprising writing the test pattern to a medium, the medium having a plurality of sectors, wherein the writing the test pattern to a medium results readable data in each sector of the medium.

6. The method of claim 1, wherein encoding the test pattern according to the second coding technique comprises encoding according to a LDPC code, wherein the LDPC encoded test pattern is not RLL decodable.

7. The method of claim 6, wherein encoding the test pattern according to the second coding technique comprises seeding the LDPC code with a test pattern indicator.

8. An apparatus for producing a flaw detection pattern comprising:
   a processor;
   memory connected to the processor; and
   computer executable program code,
   wherein the computer executable program code is configured to:
      receive a media-writable test pattern for testing readable sectors in the media;
      add error detection code data to the media-writable test pattern;
      add one or more bits according to an expansion commensurate with a first coding technique;
      scramble the test pattern; and
      encode the test pattern according to a second coding technique including adding an indicator to distinguish user data decodable according to the first coding technique and test pattern data decodable according to the second coding technique, wherein the encoded test pattern renders media defects in a data storage medium detectable.

9. The apparatus of claim 8, wherein configuring the computer executable program code to add the one or more bits according to the expansion commensurate with the first coding technique comprises further configuring the computer executable program code to add zero bits to the test pattern to achieve a desired run length based on a specific run length limited (RLL) expansion, the second coding technique being an RLL coding technique.

10. The apparatus of claim 8, wherein configuring the computer executable program code to scramble the test pattern comprises further configuring the computer executable program code to scramble the test pattern with a low-Nyquist/DC-content test pattern.

11. The apparatus of claim 10, wherein the computer executable program code is further configured to scramble the test pattern by performing an exclusive disjunction operation on the test pattern and the low-Nyquist/DC-content test pattern.

12. The apparatus of claim 8, wherein the computer executable program code is further configured to write the test pattern to a medium.

13. The apparatus of claim 8, wherein the second coding technique is a low density parity check (LDPC) coding technique, and wherein the LDPC encoded test pattern is LDPC decodable and is not RLL decodable.

14. The apparatus of claim 13, wherein the second coding technique comprises seeding the LDPC encoded test pattern with a test pattern indicator.

15. An apparatus for decoding a flaw detection pattern comprising:

a processor;

memory connected to the processor; and computer executable program code, wherein the computer executable program code is configured to:

receive user data encoded according to a first coding technique or receive a media-writable test pattern encoded according to a second coding technique from a storage medium, wherein the media-writable test pattern renders media defects in said storage medium detectable;

differentiate between the user data the test pattern using a test pattern indicator;

decode the test pattern;

descramble the test pattern;

remove error detection code data from the test pattern;

remove one or more appended bits, the removed one or more bits having been appended according to an expansion commensurate with the first coding technique; and send the test pattern to a hard disk controller.

16. The apparatus of claim 15, wherein configuring the computer executable program code to remove one or more appended bits comprises removing zero bits from the test pattern based on a specific RLL expansion.

17. The apparatus of claim 15, wherein the test pattern indicator is a test seed flag, and wherein the computer executable program code is further configured to send the test seed flag to the hard disk controller.

18. The apparatus of claim 8, wherein the computer executable program code is further configured to descramble the test pattern according to a low-Nyquist/DC-content test pattern, and wherein the computer executable program code is further configured to decode the user data according to the first coding technique.

19. The apparatus of claim 15, wherein the test pattern is decoded according to the second coding technique, the second coding technique being a low density parity check (LDPC) coding technique, and wherein the test pattern is not decoded according to the first coding technique.

20. The apparatus of claim 19, wherein the computer executable program code is further configured to read a test pattern indicator from a LDPC encoded test pattern.

* * * * *